United States Patent
Kim et al.

(10) Patent No.: US 8,809,189 B2
(45) Date of Patent: Aug. 19, 2014

(54) METHOD OF FORMING THROUGH-SILICON VIA USING LASER ABLATION

(71) Applicant: Samsung Electronics Co., Ltd., Gyeonggi-do (KR)

(72) Inventors: Eui-seok Kim, Suwon-si (KR); Sang-kyu Bang, Hwaseong-si (KR); Soo-hyun Cho, Suwon-si (KR); Choo-ho Kim, Yongin-si (KR); Won-soo Ji, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/693,795

(22) Filed: Dec. 4, 2012

(65) Prior Publication Data
US 2013/0183836 A1     Jul. 18, 2013

(30) Foreign Application Priority Data
Jan. 13, 2012  (KR) .......................... 10-2012-0004508

(51) Int. Cl.
*H01L 21/44*     (2006.01)
(52) U.S. Cl.
USPC .................. 438/667; 257/E21.597; 438/795; 438/928

(58) Field of Classification Search
USPC .................. 257/E21.597; 438/667, 795, 928
See application file for complete search history.

(56) References Cited

U.S. PATENT DOCUMENTS

| | | | |
|---|---|---|---|
| 6,429,696 B1 * | 8/2002 | Kao et al. ......................... | 327/58 |
| 2003/0183603 A1 * | 10/2003 | Forsman et al. ........... | 219/121.6 |
| 2004/0173909 A1 | 9/2004 | Sinha et al. | |
| 2004/0259329 A1 | 12/2004 | Boyle et al. | |
| 2006/0099730 A1 | 5/2006 | Lee et al. | |
| 2010/0015782 A1 | 1/2010 | Yu et al. | |
| 2011/0248263 A1 * | 10/2011 | Augur ............................. | 257/48 |

FOREIGN PATENT DOCUMENTS

| | | |
|---|---|---|
| JP | 2004-031526 A | 1/2004 |
| JP | 2009-267295 A | 11/2009 |
| KR | 10-0800161 B1 | 2/2008 |

* cited by examiner

*Primary Examiner* — Asok K Sarkar
(74) *Attorney, Agent, or Firm* — McDermott Will & Emery LLP

(57) ABSTRACT

Methods of forming through-silicon vias by using laser ablation. A method includes, laser drilling to form a plurality of grooves by irradiating a laser beam onto an upper surface of a silicon wafer, and grinding a lower surface of the silicon wafer to form a plurality of through-silicon vias by exposing the grooves on the lower surface of the silicon wafer.

16 Claims, 2 Drawing Sheets

METHOD OF FORMING THROUGH-SILICON VIA USING LASER ABLATION

CROSS-REFERENCE TO RELATED APPLICATIONS

This application claims the benefit of Korean Patent Application No. 10-2012-0004508, filed on Jan. 13, 2012, in the Korean Intellectual Property Office, the disclosure of which is incorporated herein in its entirety by reference.

BACKGROUND

1. Field

The present disclosure relates to methods of forming a through-silicon via by primarily using a laser beam and secondarily grinding a silicon wafer.

2. Description of the Related Art

Light-emitting device chips, for example, light-emitting diodes (LEDs), are referred to as semiconductor devices that realize various colors of light by configuring a light source through a PN junction of compound semiconductors. LEDs have advantages, such as a long lifetime, small size, light weight, and have a low driving voltage due to a strong directionality of light. Also, LEDs are strong against impact and vibration, do not require a preheating time and a complicated driving, and are packaged in various types, and thus, may be applied to various applications.

LEDs have been packaged with ceramic in packaging processes. Mainly alumina is used for a ceramic package. However, the ceramic package may not be applied to high output LEDs because alumina has a low heat dissipation characteristic.

AlN may be considered as a heat dissipation member for high output LED packages. However, AlN is expensive.

As another material for forming the ceramic package, silicon is frequently used in semiconductor manufacturing processes. Silicon is inexpensive and has a higher thermal conductivity than alumina, and thus, has a higher heat dissipation characteristic. After forming a through-via in a silicon wafer and forming a metal via in the through-via, the metal via may be used as an electrode for supplying power to an LED.

Conventionally, in order to form a through-silicon via, a dry etching method that is mainly used in semiconductor processes is used. In particular, a Bosch process that has a high etching rate may be used to penetrate through the silicon wafer. However, the dry etching method requires a process for preparing a photoresist and it takes a relatively long time to penetrate through the silicon wafer.

SUMMARY

Provided are methods of forming a through-silicon via by using a laser ablation process by which firstly, a long groove is formed and secondly, a through-hole is formed by using a grinding process.

Additional aspects will be set forth in part in the description which follows and, in part, will be apparent from the description, or may be learned by practice of the presented exemplary embodiments.

According to an aspect of the present disclosure, there is provided a method of forming through-silicon vias by using laser ablation. The method includes the steps of laser drilling to form a plurality of grooves by irradiating a laser beam onto an upper surface of a silicon wafer; and grinding a lower surface of the silicon wafer to form a plurality of through-silicon vias by exposing the grooves on the lower surface of the silicon wafer.

The step of laser drilling may include forming the grooves having a depth in a range from about 70% to about 90% of the thickness of the silicon wafer in a thickness direction of the silicon wafer.

The step of laser beam may be irradiated from an ultrashort pulse laser.

Power for the laser beam irradiation may be in a range from about 10 W to about 500 W.

The method may further include step of grinding the upper surface of the silicon wafer.

The step of grinding the upper surface of the silicon wafer may be performed after the step of grinding the lower surface of the silicon wafer.

The step of grinding the upper surface of the silicon wafer may be performed before the step of grinding the lower surface of the silicon wafer.

The step of grinding the lower surface of the silicon wafer may include disposing the silicon wafer on a holder such that the upper surface faces the holder and the lower surface faces a grinder.

The step of grinding the lower surface of the silicon wafer may include rotating the holder.

The method may further include the step of grinding the upper surface of the silicon wafer by re-disposing the silicon wafer on the holder such that the lower surface faces the holder and the upper surface faces the grinder.

According to another aspect of the present disclosure, there is provided a method of forming a through-via by using laser ablation. The method includes the steps of irradiating a laser beam onto a first surface of a semiconductor wafer to form a groove; and grinding a second surface of the semiconductor wafer to expose the groove on the second surface of the semiconductor wafer, thereby forming the through-via.

The step of irradiating a laser beam may include forming the groove having a depth in a range from about 70% to about 90% of the thickness of the semiconductor wafer in a thickness direction of the semiconductor wafer.

The step of irradiating a laser beam may include using an ultrashort pulse laser.

The step of irradiating a laser beam may include using power in a range from about 10 W to about 500 W.

The method may further include the step of grinding the first surface of the semiconductor wafer.

The step of grinding the first surface of the semiconductor wafer may be performed after the step of grinding the second surface of the semiconductor wafer.

The step of grinding the first surface of the semiconductor wafer may be performed before the step of grinding the second surface of the semiconductor wafer.

The step of grinding the second surface of the semiconductor wafer may include disposing the semiconductor wafer on a holder such that the first surface faces the holder and the second surface faces a grinder.

The step of grinding the second surface of the semiconductor wafer may include rotating the holder.

The method may further include the step of grinding the first surface of the semiconductor wafer by re-disposing the semiconductor wafer on the holder such that the second surface faces the holder and the first surface faces the grinder.

According to the present disclosure, in forming through-silicon vias in a silicon wafer, the method of forming through-silicon vias does not need to include the processes of coating a photoresist and cleaning the photoresist as required in the conventional dry etching process, thereby simplifying the process.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
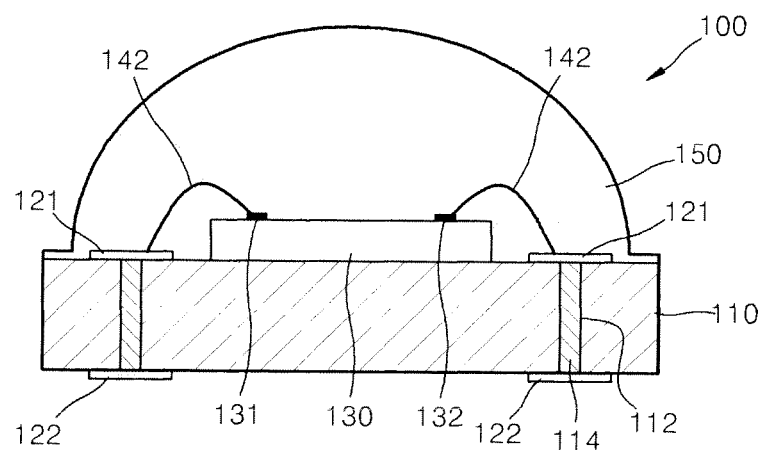
FIG. 1 is a schematic cross-sectional view of a light-emitting device package according to an exemplary embodiment of the present disclosure.

Reference will now be made in detail to embodiments, examples of which are illustrated in the accompanying drawings. In the drawings, like reference numerals refer to like elements throughout and the size and thickness of each element may be exaggerated for clarity and convenience of explanation. It will also be understood that when a layer is referred to as being "on" or "above" another layer or substrate, it can be directly on the other layer or substrate, or intervening layers may also be present.

FIG. 1 is a schematic cross-sectional view of a light-emitting device package 100 according to an exemplary embodiment of the present disclosure.

Referring to FIG. 1, the light-emitting device package 100 may include a silicon substrate 110, a light-emitting device chip 130 on the silicon substrate 110, and a light-transmitting material layer 150.

The light-emitting device chip 130 may be a light-emitting diode chip. The light-emitting diode chip may emit blue light, green light, and red light according to a material of a compound semiconductor that constitutes the light-emitting diode chip. For example, a blue light-emitting diode may include a plurality of active layers having a quantum-well layer structure in which GaN and InGaN are alternately formed. A p-type clad layer and an n-type clad layer that are formed of a compound semiconductor of $Al_xGa_yN_z$ may be formed on and under an active layer. Also, the light-emitting diode chip may emit colorless ultraviolet rays. In the current exemplary embodiment, the light-emitting device chip 130 is a light-emitting diode chip. However, the present disclosure is not limited thereto. For example, the light-emitting device chip 130 may be a UV light-emitting diode chip, a laser diode chip, or an organic light-emitting diode chip, etc.

The silicon substrate 110 has a relatively high heat dissipation characteristic when compared to a ceramic substrate, and a semiconductor process may be easily applied to the silicon substrate 110.

Through-silicon vias (TSVs) 112 are formed in the silicon substrate 110, and a metal via 114 is formed in each of the TSVs 112. The metal via 114 is connected to an electrode of the light-emitting device chip 130 to supply power to the light-emitting device chip 130.

Circuit patterns 121 and 122 are formed on both sides of the silicon substrate 110, respectively, to connect to the metal vias 114. The circuit patterns 121 and 122 may be formed by supplying a conductive material layer on a first surface and a second surface of the silicon substrate 110, respectively, by using a printing method or a plating method. The circuit pattern 121 may include two patterns respectively corresponding to a p-type electrode 131 and an n-type electrode 132 of the light-emitting device chip 130.

The connection between the light-emitting device chip 130 and the metal vias 114 may vary according to the structure of the light-emitting device chip. A horizontal type light-emitting device chip 130 may be connected to the circuit pattern 121 by a wire 142 as shown in FIG. 1. In a vertical type light-emitting device chip, at least one electrode may be connected to the metal via 114 with the circuit pattern 121, and a detailed description thereof is omitted.

The light-transmitting material layer 150 covers the light-emitting device chip 130 to protect the light-emitting device chip 130. The light-transmitting material layer 150 may control the directionality and color of light radiated from the light-emitting device chip 130. The light-transmitting material layer 150 may be formed of a material, for example, light-transmitting silicon, through which light radiated from the light-emitting device chip 130 passes.

The light-transmitting material layer 150 may have a lens shape. However, the light-transmitting material layer 150 may be formed in various shapes, such as a concave lens shape or a convex lens shape, according to an application field of the light-emitting device package 100. In FIG. 1, the exemplary light-transmitting material layer 150 has a convex lens shape.

A phosphor may be included in the light-transmitting material layer 150 in order to control the color of light radiated from the light-emitting device chip 130. The phosphor may be appropriately selected according to a desired color. The phosphor may be distributed in a light-transmitting material that constitutes the light-transmitting material layer 150.

In the current exemplary embodiment, the light-transmitting material layer 150 is a single layer. However, the present disclosure is not limited thereto. For example, the light-transmitting material layer 150 may be a double layer that includes a phosphor layer for controlling the color of light radiated from the light-emitting device chip 130 and a protection layer that covers the phosphor layer and the light-emitting device chip 130. Also, the protection layer may have a lens shape. In addition, the light-transmitting material layer 150 may have a multi-layer structure having more than two layers according to an application field of the light-emitting device package 100.

Hereinafter, a method of forming a through-silicon via to form a metal via in a silicon wafer to supply power to a light-emitting device chip will now be described.

Figure 2A:
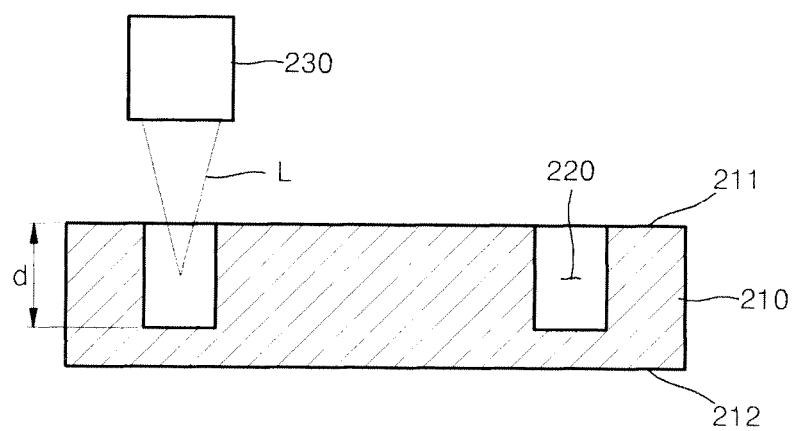
FIGS. 2A and 2B are cross-sectional views showing a method of forming a through-silicon via by using laser ablation, according to an embodiment of the present disclosure.
Figure 2B:
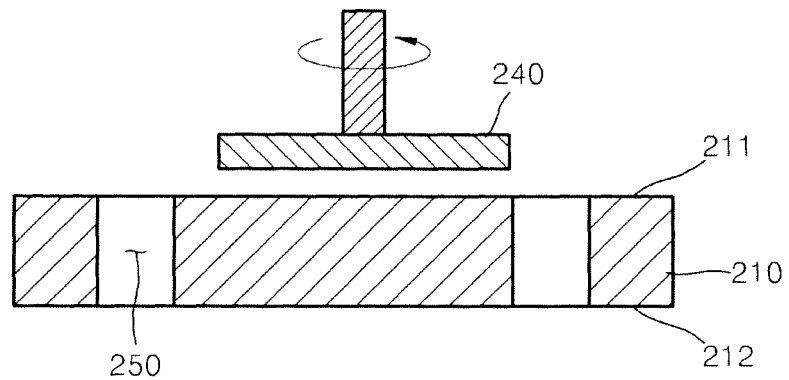

FIGS. 2A and 2B are cross-sectional views showing a method of forming a through-silicon via by using laser ablation, according to an embodiment of the present disclosure.

Referring to FIG. 2A, a silicon wafer 210 is prepared. The silicon wafer 210 has insulation characteristics if the silicon wafer 210 is not doped with a dopant in a manufacturing process. The thickness of the silicon wafer 210 may vary according to the diameter of the silicon wafer 210. For example, the silicon wafer 210 may have a thickness of 850 um.

Next, a plurality of grooves 220 are formed in the silicon wafer 210 by irradiating a laser beam L onto a first surface 211 of the silicon wafer 210. Each of the grooves 220 may be formed to have a diameter of 300 um, and a depth "d" of each of the grooves 220 may be processed to be in a range from about 70% to about 90% of the thickness of the silicon wafer 210. When a through-silicon via is directly formed in the silicon wafer 210 by laser drilling, the silicon wafer 210 may be damaged due to a thermal effect of the laser beam. Therefore, the through-silicon via is not directly formed in the silicon wafer 210 by laser drilling to avoid damage to the silicon wafer 210.

In FIG. 2A, for convenience of explanation, two grooves 220 are depicted. However, practically a few thousand grooves 220 may be formed.

A laser beam generation apparatus 230 may include a set of lenses. The laser beam generation apparatus 230 may emit an ultrashort pulse laser. Power for laser beam irradiation may be in a range from about 10 W to about 500 W. When an ultrashort pulse laser is used, laser beams may be irradiated in femtosecond units or in picosecond units, and thus, continuous transfer of heat of the laser beams to the silicon wafer 210 is prevented. Accordingly, deformation of the silicon wafer 210 due to the thermal effect by the laser beams may be minimized.

Figure 3:
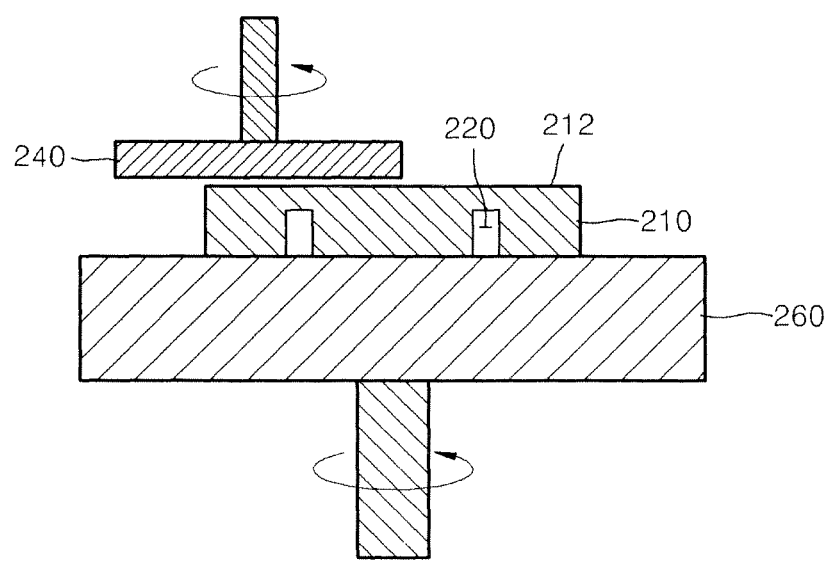
FIG. 3 is a schematic cross-sectional view of equipment for grinding a silicon wafer that is used in an embodiment of the present disclosure.

Referring to FIG. 2B, through-silicon vias 250 are formed by grinding a second surface 212 of the silicon wafer 210 by using a grinder 240. FIG. 3 is a schematic cross-sectional view of equipment used for grinding the silicon wafer 210 in an exemplary embodiment of the present disclosure. Referring to FIG. 3, after disposing the silicon wafer 210 on a ceramic holder 260, the second surface 212 of the silicon wafer 210 is ground using the grinder 240. Because the ceramic holder 260 is rotatable, the grinding may be performed by rotating the ceramic holder 260. The grinding is performed until the bottom of the groove 220 is exposed. As a result, the through-silicon vias 250 are formed.

Next, as shown in FIG. 2B, the first surface 211 of the silicon wafer 210 is ground after re-disposing the silicon wafer 210 on the ceramic holder 260 so that the first surface 211 of the silicon wafer 210 faces the grinder 240. The grinding of the first surface 211 of the silicon wafer 210 is done to remove debris formed on the first surface 211 of the silicon wafer 210 in the laser drilling operation. The debris is removed in advance because the debris may thermally damage the silicon wafer 210 in a subsequent high temperature process.

As described above, the first surface 211 of the silicon wafer 210 is ground after grinding the second surface 212 of the silicon wafer 210. However, the grinding order according to the present disclosure is not limited thereto. For example, the second surface 212 of the silicon wafer 210 may be ground after grinding the first surface 211 of the silicon wafer 210.

According to the present disclosure, in forming through-silicon vias in a silicon wafer, the method of forming through-silicon vias does not need to include processes of coating a photoresist and cleaning the photoresist as required in the conventional dry etching process, thereby simplifying the method.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of forming through-silicon vias by using laser ablation, the method comprising the steps of:
    laser drilling to form a plurality of grooves by irradiating a laser beam onto an upper surface of a silicon wafer;
    grinding a lower surface of the silicon wafer to form a plurality of through-silicon vias by exposing the grooves on the lower surface of the silicon wafer when the grooves are unfilled; and
    grinding the upper surface of the silicon wafer,
    wherein the step of laser drilling comprises forming the grooves having a depth in a range from about 70% to about 90% of the thickness of the silicon wafer in a thickness direction of the silicon wafer.

2. The method of claim 1, wherein the step of laser drilling comprises using an ultrashort pulse laser.

3. The method of claim 2, wherein the step of laser drilling comprises using power in a range from about 10 W to about 500 W.

4. The method of claim 1, wherein the step of grinding the upper surface of the silicon wafer is performed after the step of grinding the lower surface of the silicon wafer.

5. The method of claim 1, wherein the step of grinding the upper surface of the silicon wafer is performed before the step of grinding the lower surface of the silicon wafer.

6. The method of claim 1, wherein the step of grinding the lower surface of the silicon wafer comprises disposing the silicon wafer on a holder such that the upper surface faces the holder and the lower surface faces a grinder.

7. The method of claim 6, wherein the step of grinding the lower surface of the silicon wafer comprises rotating the holder.

8. The method of claim 6, further comprising the step of grinding the upper surface of the silicon wafer by re-disposing the silicon wafer on the holder such that the lower surface faces the holder and the upper surface faces the grinder.

9. A method of forming a through-via by using laser ablation, the method comprising the steps of:
    irradiating a laser beam onto a first surface of a semiconductor wafer to form a groove;
    grinding a second surface of the semiconductor wafer to expose the groove on the second surface of the semiconductor wafer when the groove is unfilled, thereby forming the through-via; and
    grinding the first surface of the semiconductor wafer,
    wherein the step of irradiating a laser beam comprises forming the groove having a depth in a range from about 70% to about 90% of the thickness of the semiconductor wafer in a thickness direction of the semiconductor wafer.

10. The method of claim 9, wherein the step of irradiating a laser beam comprises using an ultrashort pulse laser.

11. The method of claim 10, wherein the step of irradiating a laser beam comprises using power in a range from about 10 W to about 500 W.

12. The method of claim 9, wherein the step of grinding the first surface of the semiconductor wafer is performed after the step of grinding the second surface of the semiconductor wafer.

13. The method of claim 9, wherein the step of grinding the first surface of the semiconductor wafer is performed before the step of grinding the second surface of the semiconductor wafer.

14. The method of claim 9, wherein the step of grinding the second surface of the semiconductor wafer comprises disposing the semiconductor wafer on a holder such that the first surface faces the holder and the second surface faces a grinder.

15. The method of claim 14, wherein the step of grinding the second surface of the semiconductor wafer comprises rotating the holder.

16. The method of claim 14, further comprising the step of grinding the first surface of the semiconductor wafer by re-disposing the semiconductor wafer on the holder such that the second surface faces the holder and the first surface faces the grinder.

* * * * *